United States Patent
Li et al.

(10) Patent No.: US 11,518,933 B2
(45) Date of Patent: Dec. 6, 2022

(54) PRECURSOR BASED METHOD OF SYNTHESIS AND FABRICATION OF HYBRID LIGHTING PHOSPHORS WITH HIGH QUANTUM EFFICIENCY, AND SIGNIFICANTLY ENHANCED THERMAL AND PHOTOSTABILITY

(71) Applicant: Rutgers, The State University of New Jersey, New Brunswick, NJ (US)

(72) Inventors: Jing Li, Cranbury, NJ (US); Yang Fang, Piscataway, NJ (US); Wei Liu, New Brunswick, NJ (US)

(73) Assignee: RUTGERS, THE STATE UNIVERSITY OF NEW JERSEY, New Brunswick, NJ (US)

(*) Notice: Subject to any disclaimer, the term of this patent is extended or adjusted under 35 U.S.C. 154(b) by 944 days.

(21) Appl. No.: 16/304,495

(22) PCT Filed: May 15, 2017

(86) PCT No.: PCT/US2017/032604
§ 371 (c)(1),
(2) Date: Nov. 26, 2018

(87) PCT Pub. No.: WO2017/205092
PCT Pub. Date: Nov. 30, 2017

(65) Prior Publication Data
US 2019/0292450 A1     Sep. 26, 2019

Related U.S. Application Data

(60) Provisional application No. 62/341,185, filed on May 25, 2016.

(51) Int. Cl.
*C09K 11/06*  (2006.01)
*H01L 51/00*  (2006.01)
(Continued)

(52) U.S. Cl.
CPC .......... *C09K 11/06* (2013.01); *C07F 1/005* (2013.01); *C07F 1/08* (2013.01); *H01L 51/0091* (2013.01);
(Continued)

(58) Field of Classification Search
CPC .......... C09K 11/06; C09K 2211/188; C09K 2211/1029; C09K 2211/1044;
(Continued)

(56) References Cited

U.S. PATENT DOCUMENTS 10,177,325 B2*  1/2019  Li ................... H01L 51/009
2012/0045862 A1*  2/2012  Thompson .......... C07F 1/005
                                                    438/46
(Continued)

FOREIGN PATENT DOCUMENTS

CN   105408447 A    3/2016
WO   2014201377 A1  12/2014

OTHER PUBLICATIONS

Hu et al., "1D Tubular Chains and 3D Polycatenane Frameworks Constructed with Cu2X2 Dimers (X=Br-, I-, CN-)", 2006, Crystal Growth & Design, vol. 6, No. 11, pp. 2543-2550. (Year: 2006).*
Chen et al., "Solvent Effects on the Assembly of [Cu2I2]- or [Cu4I4]-Based Coordination Polymers: Isolation, Structures, and Luminescent Properties", 2008, Crystal Growth & Design, vol. 8, No. 10, pp. 3810-3816. (Year: 2008).*
(Continued)

*Primary Examiner* — Matthew E. Hoban
*Assistant Examiner* — Lynne Edmondson
(74) *Attorney, Agent, or Firm* — Fox Rothschild LLP

(57) ABSTRACT

Highly thermal and photo-stable inorganic-organic hybrid phosphor compounds, in which a copper (I) halide module is coordinated with a multi-dentate organic ligand. Also disclosed are semiconductor and light emitting devices comprising these materials, including light emitting diodes, and methods of preparing these materials and devices.

17 Claims, 2 Drawing Sheets

(51) Int. Cl.
*C07F 1/08* (2006.01)
*C07F 1/00* (2006.01)
*H01L 51/50* (2006.01)
*H01L 51/52* (2006.01)

(52) U.S. Cl.
CPC .......... *C09K 2211/1029* (2013.01); *C09K 2211/1044* (2013.01); *C09K 2211/188* (2013.01); *H01L 51/5016* (2013.01); *H01L 51/5271* (2013.01)

(58) Field of Classification Search
CPC .......... C09K 2211/1022; H01L 33/502; H01L 33/60; H01L 33/5036; H01L 51/009; H01L 51/0091; H01L 51/5271; C07F 1/08
See application file for complete search history.

(56) References Cited

U.S. PATENT DOCUMENTS

2014/0197400 A1 7/2014 Li et al.
2016/0028036 A1 1/2016 Xue

OTHER PUBLICATIONS

Peng, et al: "Copper(I) Halides: A Versatile Family in Coordination Chemistry and Crystal Engineering", Coordination Chemistry Reviews, Jan. 2010, vol. 254, pp. 1-18.

Chen, et al: "Solvent Effects on the Assembly of [Cu2I2]-or [Cu4I4]-Based Coordination Polymers: Isolation, Structures, and Luminescent Properties", Crystal Growth & Design, 2008, vol. 8, No. 10, pp. 3810-3816.

Vitale, et al: "Luminescent Mixed Ligand Copper(I) Clusters (CuI) (L) (L=pyridine, piperidine): Thermodynamic Control of Molecular and Supramolecular Species", Coordination Chemistry Reviews, 2001, vol. 219-221, pp. 3-16.

\* cited by examiner

PRECURSOR BASED METHOD OF SYNTHESIS AND FABRICATION OF HYBRID LIGHTING PHOSPHORS WITH HIGH QUANTUM EFFICIENCY, AND SIGNIFICANTLY ENHANCED THERMAL AND PHOTOSTABILITY

CROSS-REFERENCE TO RELATED APPLICATIONS

This application claims priority under 35 U.S.C. § (119(e) to U.S. Provisional Patent Application Ser. No. 62/341,185, filed on May 25, 2016, which is hereby incorporated by reference in its entirety.

STATEMENT REGARDING FEDERALLY FUNDED RESEARCH

This invention was made in part with government support under Grant No. DMR-1507210 awarded by the National Science Foundation. The government has certain rights in the invention.

FIELD OF THE INVENTION

The present invention relates to the field of light emitting materials, which emit strongly over the entire visible spectrum, including for example white, orange, green, blue and yellow color, devices made therefrom, and methods of making these materials and devices.

BACKGROUND OF THE INVENTION

Concerns about global warming have led to a worldwide effort in the science community to reduce greenhouse gas emissions and to increase energy efficiency. Conservation of energy through gradual diversion of resources to renewable green energy paves the way for tomorrow's lower consumption and cleaner environment. Solid-state lighting ("SSL") technology in the form of light-emitting diodes ("LEDs") generates high-efficiency light sources, converts electricity into light much more effectively than conventional lighting sources. The U.S. Department of Energy has estimated that switching to LED lighting over the next two decades could save the country $250 billion in energy costs over that period, which could reduce the electricity consumption for lighting by nearly one half, and avoid 1,800 million metric tons of carbon dioxide emission.

Low-cost and high-efficiency white light emitting diodes ("WLEDs") (e.g. 144 lm/W) are considered a potential light source to replace conventional incandescent (e.g. 15 lm/W) or fluorescent lighting (e.g. 114 lm/W) prevalent in major infrastructures. Other applications range from computer displays to car headlights. However, major setbacks of SSL are the cost, the dependence on the rare earth ("RE") elements, which are in serious supply shortage, and the lack of their recyclability, thus causing damages to the environment. Today, the purchase price of WLED lighting products is significantly higher than that of their conventional counterparts, and the energy savings often are not enough to offset the difference within an attractive payback period.

A need thus exists for the design of more efficient, earth-abundant, stable, and environmental friendly phosphors.

Therefore, developing new types of phosphors, especially white/yellow/orange phosphors and/or white/yellow/orange light emitting semiconductor materials that are energy efficient, cost-effective, and free of RE elements is of great importance and in high demand for solid state lighting technologies.

SUMMARY OF THE INVENTION

The present invention met such a need. Described herein is a novel class of phosphor compounds that emit intensive yellow or orange light with high luminescence quantum efficiency, coupled with large Stokes shift that greatly reduces self-absorption. Advantages of these phosphors also include high quantum yields and prolonged stability.

In one aspect, the present invention provides an inorganic-organic hybrid phosphor compound of the formula $Cu_mX_m(L_1)_o(L_2)_p$, wherein:

X is a halogen, $L_1$ is an organic multi-dentate ligand, wherein at least two atoms of the ligand are heteroatoms each independently selected from N, O and S and the two heteroatoms are each coordinated to a Cu atom in a respective cluster so that each of said $L_1$ links two $Cu_mX_m$ clusters, $L_2$ is an organic mono-dentate or multi-dentate ligand, wherein at least 1 atom of the ligand are heteroatoms independently selected from N, O and S and the Cu atom is coordinated to one of these heteroatoms, m is an integer of 1, 2, 3, 4, 5, or 6, and and p are each independently selected from 0, 1, 2, 3, 4, and 6, provided that o and p are not both 0, wherein the atoms of the compound are arranged to form a network having a 1-D, 2-D or 3-D crystalline lattice structure.

$L_1$ and $L_2$ are independently a 5-10 membered heteraryl or heterocyclyl group. In some embodiments, X is I, and m is 1, 2 3 or 4. In some embodiments, the inorganic-organic hybrid phosphor compound is characterized by a crystal structure that consists essentially of a Cu—X motif selected from the group of rhomboid dimers, cubane tetramers, and other $Cu_mX_m$ clusters. In some embodiments $L_1$ is bi-dentate ligand and $L_2$ is a mono-dentate ligand.

In some embodiments of the inorganic-organic hybrid phosphor compound, o is 2, p is 0, and said crystalline structure is formed from a plurality of recur-ring 1D $Cu_4X_4(L_1)_2$ structures, wherein said recurring 1D $Cu_4X_4(L_1)_2$ structure is formed from a recurring unit of $Cu_4X_4(L_1)_2$ In some embodiments, the 1D lattice structures stack together with each other through the aligned organic ligands to form orderly 2D and/or 3D crystalline lattice structures.

In some embodiments of the inorganic-organic hybrid phosphor compound, o is 2, p is 0, and said crystalline structure is formed from a plurality of recurring 2D-$Cu_4X_4(L_1)_2$ lattice structures, wherein said recurring 2D-$Cu_4X_4(L_{12}$ structure is formed from a recurring unit of $Cu_4X_4(L_1)_2$. In some embodiments, an orderly 3D crystalline lattice structures are formed via recurring $Cu_4X_4(L_1)_2$ units extended in all three dimensions, preferably linked by covalent bonding.

In some embodiments, X is I, and $L_1$ is an organic ligand comprising a 5, 6, 7, 9 or 10-membered substituted or unsubstituted heteroaromatic group.

In some embodiments, $L_1$ is a bidentate ligand selected from pyrimidine (pm), bipyridine (bpy), bi-imidazole, benzoimidazole, and bi-benzoimidazole and pyrazine (pz), each optionally substituted by one, two or three substituents independently selected from halogens, $-OR^1$, $-SR^1$, $-C_1-C_4SR^1$, $-C_1-C_4$ alkyl, $-NO_2$, $-CN$ and $-NR^aR^b$, wherein $R^1$ at each occurrence is independently hydrogen (H) or $C_1-C_4$ alkyl, and $R^a$ and $R^b$ are independently hydrogen or $C_1-C_4$ alkyl.

In some embodiments, L is selected from 5-methyl-pyrimidine (5-me-pm), 4,6-dimethyl-pyrimidine (4,6-dm-pm), 1,3-propandiamine (pda), 3,3'-bipyridine (3,3'-bpy), 1,3-bis(4-pyridyl)propane (bpp), 4,4'-dipyridyl sulfide (4,4'-dps), ethylene diamine (en), bibenzoimidazolylpentane (bbipe), diimidazolylpentanedipe, bi-5-methyl-benzoimid-azolylpentane (bmbipe), 1,4-butyldiamine (1,4-bda), bi-5,6-di-methyl-benzoimid-azolylpentane (bdmbipe), and 1-(methylsulfur-methylenyl)-benzoimidazole (msmbi).

In some embodiments, the phosphor compound is selected from 1D-$Cu_4I_4(bbipe)_2$, 1D-$Cu_4I_4(msmbi)_2$, 2D-$Cu_4I_4(pda)_2$, 2D-$Cu_4I_4(dipe)_2$, 2D-$Cu_4I_4(bmbipe)_2$, 2D-$Cu_4I_4(bpp)_2$, 2D-$Cu_4I_4(4,4'$-$dps)_2$, 3D-$Cu_4I_4(1,4$-$bda)_2$, 3D-$Cu_4I_4(en)_2$, 3D-$Cu_4I_4(dipe)_2$, and 2D-$Cu_4I_4(5$-me-pm$)_2$.

In another aspect, the present invention provides a composite, comprising a mixture of $Cu_4X_4(L_1)_2$ and $Cu_2X_2(L_1')(L_2')_2$. X is a halogen, $L_1$ is a multi-dentate ligand, $L_1'$ is a mon-dentate ligand or a multi-dentate ligand, $L_2'$ is a mono-dentate ligand. $L_1'$ is a mono-dentate ligand including for example triphenyl-phosphine (tpp), py, bpy, bpp, pm, pz, 4-Cl-py, 3-Br-py, 3-I-py, 4-$NH_2$-py, 2-Br-pm, 3-$CH_3$-py (3-picoline) and 4-$CH_3$-py (4-picoline).

In some embodiment, $Cu_4I_4(L_1)_2$ is a phosphor compound emitting yellow or orange light. In some embodiments, $Cu_2X_2(L_1')(L_2')_2$ is a phosphor compound emitting blue light.

In some embodiments, the yellow or orange phosphor compound and the blue phosphor compound are each in the form of a network having a 1D, 2D or 3D crystalline lattice structure, and the amount of the blue phosphor compound is about 1% to about 99%, all subranges and subvalues included, of the total weight of said yellow or orange phosphor compound and said blue phosphor compound. In some embodiments, the amount of the blue phosphor compound is about 5% to about 30% by weight.

In another aspect, the present invention provides light-emitting diodes characterized by a chip coated with an inorganic-organic hybrid phosphor compound or composite disclosed herein.

In another aspect, the present invention provides a method of emitting a visible light comprising exposing the phosphor compound or the composite described herein to an excitation source with blue, UV or near UV light.

In another aspect, the present invention provides a method of preparing the phosphor compound described herein, comprising the steps of (a) providing a compound of $Cu_4X_4(L_1')_o(L_2')_p$, wherein X is a halogen, $L_1'$ and $L_2'$ are each a mono-dentate ligand, and o and p are each independently selected from 0, 1, 2, 3, 4, 5 and 6, provided that o and p are not both 0;

(b) mixing said compound with a multi-dentate ligand $L_1$ in a solution; and (c) isolating the phosphor compound.

In some embodiments, the solution comprises an alcohol solvent. In some embodiments, step (b) further comprises heating said solution.

These and other aspects of the present invention will be described in greater detail below.

DETAILED DESCRIPTION OF THE INVENTION

Figure 1:
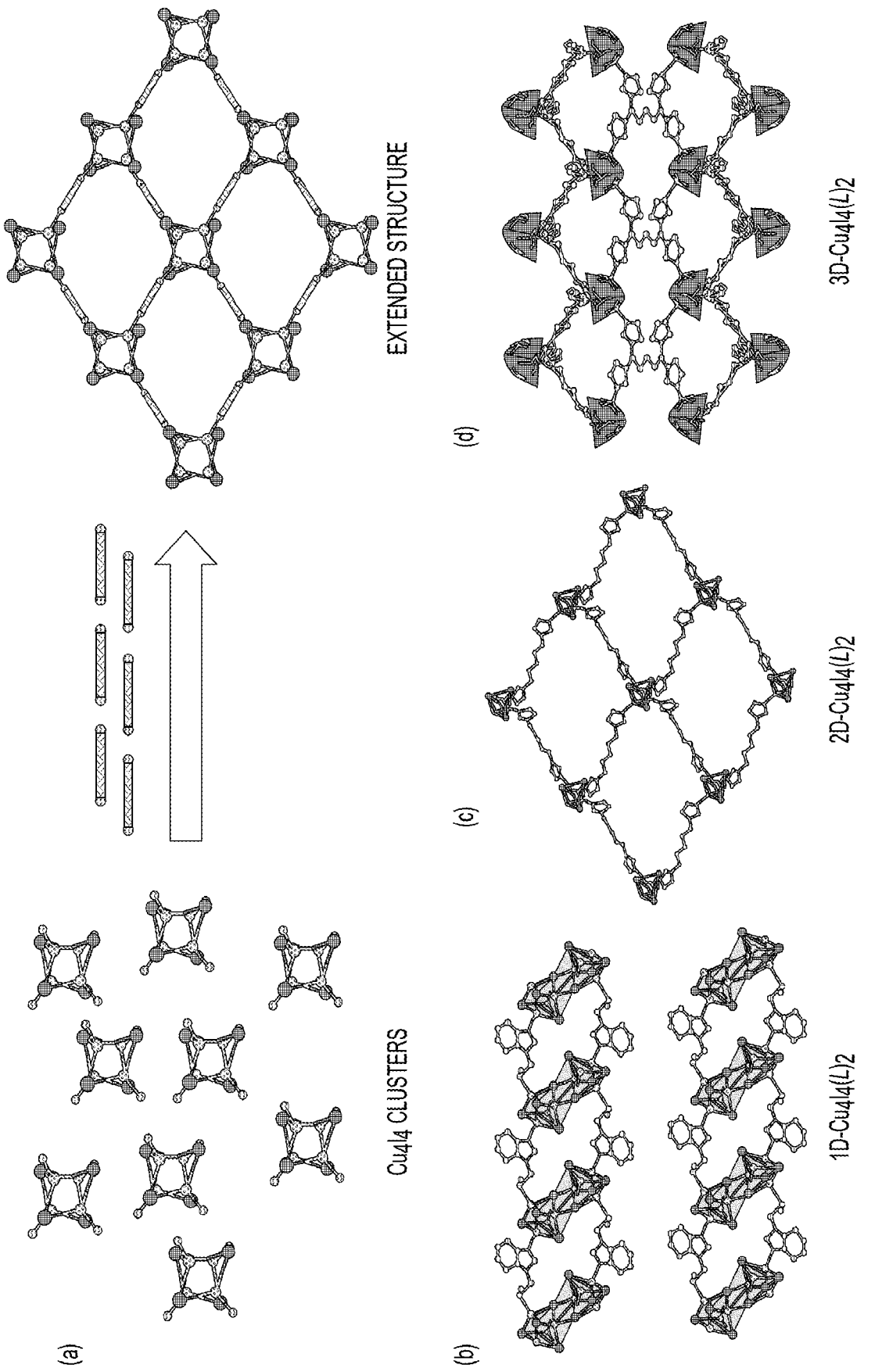
FIGS. 1(a)-1(d) illustrates the $Cu_4I_4$ clusters and extended network structures. 1(a) $Cu_4I_4$ clusters; 1(b) 1D-$Cu_4I_4$(msmbi)$_2$ (8); 1(c) 2D-$Cu_4I_4$(dipe)$_2$ (10) and 1(d) 3D-$Cu_4I_4$(dipe)$_2$ (17). Color scheme: Cu: cyan; I: purple; N or mono-dentate N-ligands: blue; S: yellow; C: grey; bi-dentate ligands: yellow rods with blue ends.

Various embodiments of the present invention provides a novel class of CuX (X: halide) based inorganic-organic hybrid structures with excellent luminescence efficiency and stability. Compared to the molecular Copper (I) iodide clusters containing monodentate ligand (e.g. pyridine), both the photo and thermal stability of the new structures are significantly improved as a result of incorporating the strongly emissive CuI core into 1D, 2D or 3D extended networks.

While the following text may reference or exemplify specific components of a device or a method of utilizing the device, it is not intended to limit the scope of the invention to such particular references or examples. Various modifications may be made by those skilled in the art, in view of practical and economic considerations, such as the ligand and the method of preparing the compounds of the present invention.

The articles "a" and "an" as used herein refers to "one or more" or "at least one," unless otherwise indicated. That is, reference to any element or component of the present invention by the indefinite article "a" or "an" does not exclude the possibility that more than one element or component is present.

The term "about" as used herein refers to the referenced numeric indication plus or minus 10% of that referenced numeric indication.

Crystalline inorganic-organic hybrid compounds combine the good features of both constituents in a single crystal lattice, thereby giving rise to significant enhancement of their overall optical properties. Some of these hybird compounds have been reported for their strong luminescences. Among them, compounds made of copper(I) halides (mostly iodides) and mono-dentate or bi-dentate N-containing ligands are of particular interest due to their solution processability, structural diversity, earth abundance, and high luminescence. As a result they are considered as one of the most promising material groups as low-cost, rare earth element-free phosphor candidates. Various structure motifs have been prepared by mixing copper iodide and organic ligands of different ratios and under different reaction conditions. Rhomboid dimers, cubic tetramers and staircase-like chains are the three most common building motifs of this compound family. Most of these compounds are luminescent and emit within the visible light region. However, the compounds disclosed in earlier reports suffer from low quantum yield (QY). On the other hand, $Cu_2I_2$ dimer-based molecular structures show high QYs comparable to commercial phosphors, however, their photo and thermal stability are generally poor. In attempt of resolving these issues and preparing phosphors with both high QY and framework stability, a new synthetic approach has been developed. The new approach generally involves a two-step process: (1) synthesis of highly emissive $Cu_mX_m$ molecular clusters as precursors, and (2) construction of robust and extended network structures using these molecular precursors as building blocks and ligands that form strong Cu—N bonds as linkers. The multi-dentate ligands connect the $Cu_mX_m$ molecular clusters to form a network having a 1D, 2D or 3D crystalline lattice structure.

In one aspect, the present invention provides an inorganic-organic hybrid phosphor compound of the formula $Cu_mX_m(L_1)_o(L_2)_p$. X is a halogen. $L_1$ is an organic multi-dentate ligand, wherein at least two atoms of the ligand are heteroatoms independently selected from N, O and S and the two atoms are each coordinated to a Cu atom in a respective $Cu_mX_m$ cluster. As a result, each $L_1$ links two adjacent $Cu_mX_m$ clusters. $L_2$ is an organic mono-dentate or multi-dentate ligand, wherein at least 1 atom of the ligand are heteroatoms independently selected from N, O and S and the Cu atom is coordinated to one of these heteroatoms. A multi-dentate ligand can coordinate to two, three or more Cu atoms. The subscript m is an integer of 1, 2, 3, 4, 5, or 6. The subscripts o and p are each independently selected from 0, 1, 2, 3, 4, 5, and 6, provided that o and p are not both 0. The atoms of the compound are arranged to form a network having a 1-D, 2-D or 3-D crystalline lattice structure. Each $L_1$ coordinates to two recurring units of $Cu_mX_m$ in the network crystalline structure.

The crystalline lattice structure of the above compounds consists essentially of a motif selected from rhomboid dimers, cubane tetramers and staircase chains. In some embodiments, the crystalline lattice structure consists essentially of cubane tetramers. FIG. 1 illustrates the design and incorporation of molecular $Cu_4I_4$ core into an extended 1D, 2D, and 3D network structure. The synthesis generally starts with the preparation of highly emissive molecular clusters (e.g. 0D-$Cu_4I_4$(L)4; L=mono-dentate ligand). Extended network structures of 1D, 2D, and 3D are subsequently constructed using the molecular clusters as building units and multidentate N-containing ligands that form strong M-N (M=metal) bonds. Details of various ligands with enhanced photo and thermal stability are provided in Table 1 below.

CuX as used herein includes copper (I) fluoride, copper (I) chloride, copper (I) bromide and copper (I) iodide. In some embodiments, X is I. Among various $Cu_xI_x$ based molecular species, the cubic $Cu_4I_4$ clusters demonstrate the strongest emission in yellow-orange region, making them attractive phosphor candidates for "warm" WLEDs (low CCT, high CRI). The geometry of the $Cu_4I_4$ is usually a distorted cubane, and can also be considered as two $Cu_2I_2$ dimer fragments oriented perpendicular to each other. A well-studied example of this structure type, 0D-$Cu_4I_4(py)_4$ (py=pyridine), emits strong yellow light (560 nm) under UV irradiation at room temperature, with an impressively high QY of 92%. The emissions of various tetranuclear $Cu_4I_4(L)_4$ clusters (in various solutions and at different temperatures) have been attributed to several different mechanisms, including cluster centered (CC), metal to ligand charge transfer (MLCT), halide to ligand charge transfer (XLCT), and sometimes a combination of these. However, the thermal stability of 0D-$Cu_4I_4(py)_4$ (or other 0D-$Cu_4I_4(L)_4$ clusters) is simply too low for any practical applications, as it decomposes at temperatures as low as 60° C. By substituting the mono-dentate (terminal) ligand of the molecular precursor with selected multi-dentate ligands while keeping highly emissive $Cu_4I_4$ core intact, the extended 1D, 2D and 3D network structures so-obtained exhibit greatly enhanced structural stability.

The multi-dentate ligand serves an important role in the formation of the extended network structure. For the compound of $Cu_mX_m(L_1)_o(L_2)_p$, $L_1$ and $L_2$ be the same or different multi-dentate ligands. When $L_1$ and $L_2$ be the same multi-dentate ligands, the formula can be simplified as $Cu_mX_m(L)_{o+p}$, where L is the multi-dentate ligand. In some embodiments of the inorganic-organic hybrid phosphor compound has a formula of $Cu_4X_4(L)_2$. In some embodiments, p is 0 and the compound is $Cu_mX_m(L_1)_o$, wherein o is 1, 2, 3 or 4. In some embodiments of $Cu_mX_m(L_1)_o$, o is 2 or 4, m is 4, and X is I. In some embodiments, $L_1$ contains a 5- and/or 6-membered substituted or unsubstituted heteroaromatic group.

Besides the network structure, the color of a phosphor compound is also affected by the ligand. An organic ligand contains one or more heteroatoms in an aromatic ring, an aliphatic group, or each of these. A multi-dentate ligand thus may have a symmetrical or asymmetrical structure, wherein each of two heteroatom-containing moieties coordinates to a Cu atom. Non-limiting examples of rings containing heteroatoms include azepinyl, benzimidazolyl, benzisoxazolyl, benzofurazanyl, benzopyranyl, benzothiopyranyl, benzofuryl, benzothiazolyl, benzothienyl, benzoxazolyl, chromanyl, cinnolinyl, dihydrobenzofuryl, dihydrobenzothienyl, dihydrobenzothiopyranyl, dihydrobenzothiopyranyl sulfone, 1,3-dioxolanyl, furyl, imidazolidinyl, imidazolinyl, imidazolyl, indolinyl, indolyl, isochromanyl, isoindolinyl, isoquinolinyl, isothiazolidinyl, isothiazolyl, isothiazolidinyl, morpholinyl, naphthyridinyl, oxadiazolyl, 2-oxoazepinyl, oxazolyl, 2-oxopiperazinyl, 2-oxopiperidinyl, 2-oxopyrrolidinyl, piperidyl, piperazinyl, pyridyl, pyrazinyl, pyrazolidinyl, pyrazolyl, pyridazinyl, pyrimidinyl, pyrrolidinyl, pyrrolyl, quinazolinyl, quinolinyl, quinoxalinyl, tetrahydrofuryl, tetrahydro-isoquinolinyl, tetrahydro-quinolinyl, thiamorpholinyl, thiamorpholinyl sulfoxide, thiazolyl, thiazolinyl, thienofuryl, thienothienyl, thienyl and triazolyl. Non-limiting examples of non-ring structures containing heteroatoms include aminoalkyl, thiol, thioether, hydroxyl, ether, amide, ester, and carboxylic acid. Further examples of bidentate ligands include pyrimidine (pm), bipyridine (bpy), bi-imidazole, benzoimidazole, and bi-benzoimidazole and pyrazine (pz). Each of the aryl, heteroaryl, ring, or aliphatic moiety of a ligand is optionally substituted by one, two or three substituents. Exemplary substituents include halogens, —$OR^1$, —$SR^1$, —$C_1$-$C_4SR^1$, —$C_1$-$C_4$ alkyl, —$NO_2$, —CN and —$NR^aR^b$, wherein $R^1$ at each occurrence is independently hydrogen (H) or $C_1$-$C_4$ alkyl, and $R^a$ and $R^b$ are independently hydrogen or $C_1$-$C_4$ alkyl.

A multi-dentate ligand can contain a linker connecting two heteroatom-containing moieties, each of which coordinates to a Cu atom. For example, the ligand can be an aryl group linked to a non-aryl group, two aryl groups joined into the same molecule, two amino groups linked together. The linker between two heteoatom-containing moieties in a ligand can be an aryl group, a heteroaryl group, a straight or branched chain structure, a non-aromatic ring, a single atom, or any combination of these. In some embodiments, the linker is a C1-C10 carbon linker, wherein any carbon in the linker can be further substituted or replaced with a heteroatom.

Non-limiting examples of bi-dentate ligands include benzoimidazolyl-propane (bipr), 5-methyl-pyrimidine (5-me-pm), 4,6-dimethyl-pyrimidine (4,6-dm-pm), 1,3-propandiamine (pda), 3,3'-bipyridine (3,3'-bpy), 1,3-bis(4-pyridyl) propane (bpp), 4,4'-dipyridyl sulfide (4,4'-dps), ethylene diamine (en), bibenzoimidazolylpentane (bbipe), diimidazolylpentane (dipe), bi-5-methyl-benzoimidazolylpentane (bmbipe), 1,4-butyldiamine (1,4-bda), bi-5,6-di-methyl-benzoimidazolylpentane (bdmbipe), and 1-(methyl-sulfurmethylenyl)-benzoimidazole (msmbi).

The extended network constructed from the highly emissive molecular cluster precursor and the multi-dentate ligand can be a 1D, 2D or 3D structure. In some embodiments, the network structure is a crystalline structure formed from a plurality of recur-ring 1D $Cu_4X_4(L_1)_2$ lattice structures, and the recurring 1D-$Cu_4X_4(L_1)_2$ structure is formed from a recurring unit of $Cu_4X_4(L_1)_2$. For example, compound 8 of Table 1 includes a bi-dentate ligand (msmbi), which coordinates to two clusters through a sulfur and a nitrogen atom. The 1D lattice structures can stack together with each other through the aligned organic ligands to form orderly 2D and/or 3D crystalline lattice structures.

In some embodiments, the network structure is a crystalline structure formed from a plurality of recurring 2D-$Cu_4X_4(L_1)_2$ lattice structures, and the recurring 2D-$Cu_4X_4(L)_2$ structure is formed from a recurring unit of $Cu_4X_4(L_1)_2$. Examples include compounds 9, 10, 11, 12 and 14 of Table 1.

In some embodiments, the network structure is a crystalline structure formed from a plurality of recurring 3D-$Cu_4X_4(L_1)_2$ lattice structures, and the recurring 3D-$Cu_4X_4(L_1)_2$ structure is formed from a recurring unit of $Cu_4X_4(L_1)_2$. Examples include compounds 15, 16 and 17 of Table 1.

The phosphor compound may emit a yellow or orange light. Exemplary phosphor compounds include 1D-$Cu_4I_4$ (bbipe)$_2$, 1D-$Cu_4I_4$ (msmbi)$_2$, 2D-$Cu_4I_4$ (pda)$_2$, 2D-$Cu_4I_4$ (dipe)$_2$, 2D-$Cu_4I_4$ (bmbipe)$_2$, 2D-$Cu_4I_4$ (bpp)$_2$, 2D-$Cu_4I_4$ (4,4'-dps)$_2$, 3D-$Cu_4I_4$ (1,4-bda)$_2$, 3D-$Cu_4I_4$ (en)$_2$, 3D-$Cu_4I_4$ (dipe)$_2$, and 2D-$Cu_4I_4$ (5-me-pm)$_2$. Additional examples of phosphor compounds emitting green, blue, orange or yellow light include 1D-$Cu_2I_2(tpp)_2$(1,3-bpp), 1D-$Cu_2I_2(tpp)_2$(4,4'-dps), 1D-$Cu_2I_2$(5-me-pm)$_2$, 2D-$Cu_2I_2$(3,3'-bpy)$_2$, 1D-$Cu_2I_2$(tpp)$_2$(5-Br-pm), and nD-$Cu_4I_4$(bdmbipe)$_x$.

Additional example compounds of the present invention include 3D-$Cu_4I_4$(ted)$_4$ (TED: 1,4-Diazabicyclo[2.2.2]octane) and 0D-$Cu_2I_2$(tpp)$_2$(4,6-dm-pm)$_2$. It is noted that 0D compounds described herein can also be used as soluble molecular precursors to prepare the 1D, 2D, 3D compounds with extended network.

Another aspect of the invention provides a composite which contains two or more phosphor compounds, each of which can be as described above. In some embodiments, the composite include a yellow or orange phosphor compound and a blue phosphor compound. The yellow or orange phosphor compound is generally of the formula $Cu_mX_m(L_1)_o(L_2)_p$, which is defined above. In some embodiments, the yellow or orange phosphor compound is $Cu_4X_4(L_1)_2$, wherein X is iodide and $L_1$ is a multi-dentate ligand as described above.

The blue phosphor compound can be represented with $Cu_uX_v(L_1')_s(L_2')_t$, wherein X is a halogen, $L_1'$ is a mondentate ligand or a multi-dentate ligand, $L_2'$ is a monodentate ligand. The multi-dentate and mono-dentate ligands are as described above. The subscripts u, v, s and t are each independently 1, 2, 3, or 4. In some embodiments, x is iodide, u and v are each 2. In some embodiments, the blue phosphor is of the formula $Cu_2X_2(L_1')(L_2')_2$, wherein X is iodide. In some embodiments, $L_1'$ is a multi-dentate ligand which is described above. In some embodiments, $L_2'$ is a mono-dentate ligand is ligand doped into the phosphor to modify its emission color. Examples of $L_2'$ include triphenylphosphine (tpp), py, bpy, bpp, pm, pz, 4-Cl-py, 3-Br-py, 3-I-py, 4-NH$_2$-py, 2-Br-pm, 3-CH$_3$-py (3-picoline) and 4-CH$_3$-py (4-picoline). A blue phosphor compound can be prepared by, for example, doping a yellow or orange phosphor compound with a secondary ligand during ligand exchange stage. An example blue phosphor is 1D-$Cu_2I_2$(tpp)$_2$(bpp) (tpp=triphenylphosphine).

When mixing two phosphor together in a suitable percentage, the composite can emit a new color. In some embodiments, the amount of the blue phosphor compound is about 0.1% to about 99.9% of the total weight of the yellow or orange phosphor compound and the blue phosphor compound. Exemplary ranges of amount of the blue phosphor compound include about 1-5%, about 5-10%, about 10-15%, about 15-20% and about 20-25%. Other exemplary ranges of the blue phosphor include less than about 30%, less than about 20%, less than about 15%, less than about 10%, less than about 5%, and less than about 1% of the total weight of the yellow or orange phosphor compound and the blue phosphor compound. Further non-limiting examples of the amount of the blue phosphor compound in the mixture include about 1%, about 2%, about 3%, about 5%, about 8%, about 10%, about 15%, about 20%, and about 25%.

The compounds of the present invention can be configured into structures that are useful in the fabrication of electrical and optical devices by conventional means well known to those of ordinary skill in the art. These include, but are not limited, to interlayer dielectric devices in microelectronics, thermo-electric devices for cooling, beating and generating electricity, and quantum well laser structures useful in optoelectric devices for the generation or modulation of light radiation, including the modulation of light radiation for the transmission of information. The compounds of the present invention may also be used in infra-red photodetectors, lasers for spectroscopic and fiber optic applications, electroluminescent lasers and electronic phosphors. In particular, the inorganic-organic hybrid compounds can be used in light-emitting devices to generate direct white light.

Light emitting diodes (LEDs) based on the inorganic-organic hybrid compounds or composite of the present invention are prepared by substituting the inorganic-organic hybrid compounds of the present invention for the semiconductor compounds conventionally used in the semiconductor die of an LED. That is, a chip/die coated with the inorganic-organic compound or composite of the present invention is placed in conductive contact between an anode and a cathode within a reflective cavity. The chip/die converts electricity to light, which is an excitation source for the phosphor to absorb and then emit light.

Another aspect of the invention provides a method of emitting a visible light, with an emphasis on yellow and orange light. Generally, the phosphor compound is exposed to a light excitation source which can be for example, a blue or UV or near-UV die/chip. The phosphor absorbs the blue, UV or near-UV light and convert them to yellow or other colored light. In some embodiments, the method includes (a) placing a die or chip coated with an inorganic-organic compound or composite of the present invention in conductive contact between an anode and a cathode within a reflective cavity; and (b) passing a current from the anode to the cathode. The phosphor compound can also be coated on a substrate (e.g. a lamp, a film, a garment or any suitable surface). Upon exposure to an excitation source (e.g. UV, visible light, or infrared), the phosphor will emit a visible light.

Another aspect of the invention provides a method of preparing the phosphor compound described herein. The method includes:
(a) providing a compound of $Cu_mX_m(L_1')_o(L_2')_p$, wherein X is a halogen, $L_1'$ and $L_2'$ are each a mono-dentate ligand, and m, o and p are as defined above;

(b) mixing said compound with a multi-dentate ligand $L_1$ in a solution, wherein $L_1$ is as defined above; and (c) isolating said phosphor compound.

A secondary mono-dentate or multi-dentate ligand $L_2$ can also be introduced at step (b). Non-limiting examples of $L_1'$ and $L_2'$ independently include triphenylphosphine (tpp), py, bpy, bpp, pm, pz, 4-Cl-py, 3-Br-py, 3-I-py, 4-NH$_2$-py, 2-Br-pm, 3-CH$_3$-py (3-picoline) and 4-CH$_3$-py (4-picoline). In some embodiments, m is 4, and o is 2 or 4, and p is 2 or 0. In some embodiments, X is Br, I or Cl.

Suitable cluster precursors include $(CuX)_n$ (n=2-6), which are coordinated to a monodentate ligand. To promote the ligand exchange, heat can be applied. Various solvents can be used in the solution. In some embodiments, the solvent is an alcohol. Examples include methanol, ethanol, and propanol.

The following non-limiting examples set forth herein below illustrate certain aspects of the invention.

Examples

A. Ligand Synthesis

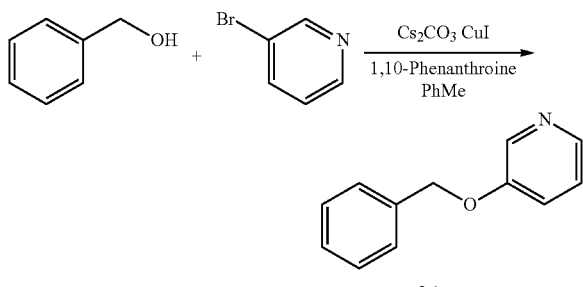

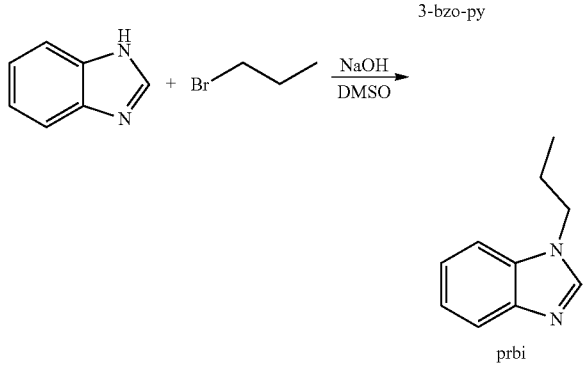

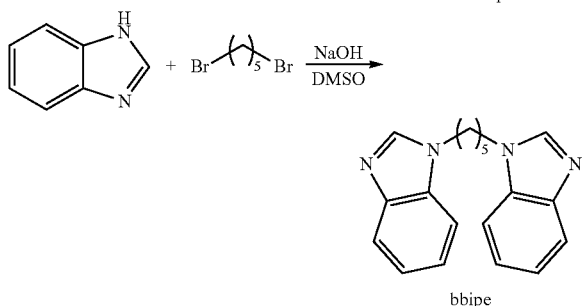

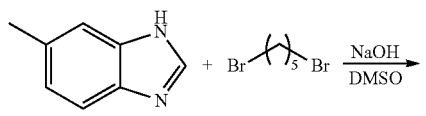

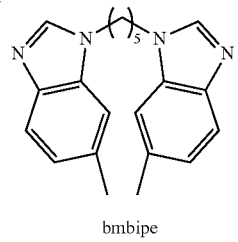

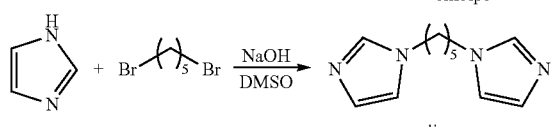

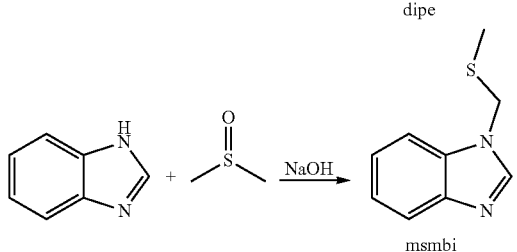

Synthesis of 3-(benzyloxy)pyridine (3-bzo-py): To a mixture of 76 mg (0.40 mmol) CuI, 1,10-phenanthroline 144 mg (0.80 mmol), cesium carbonate 1.9 g (6.00 mmol), and 3-bromopyridine (4.00 mmol) in a dry Schlenk flask (evacuated and nitrogen purged) were added 5 mL of toluene and benzyl alcohol (40 mmol) and heated in an oil bath at 110° C. for 24 h. The reaction mixture was filtered and solvent removed under reduced pressure. The crude residue obtained was subjected to flash chromatography (eluent: ethyl acetate/hexanes) and the purified product characterized by 1H NMR (300 MHz, CDCl$_3$) δ (ppm): 5.11 (s, 2H), 7.16-7.44 (m, 7H), 8.22-8.40 (m, 2H), yield 80%.

Synthesis of 1-propyl-1H-benzo[d]imidazole (prbi): 1.2 g (30 mmol) NaOH was added to a solution of 1.18 g (10 mmol) benzimidazole in 20 ml DMSO, the mixture was stirred at 70° C. for 2 hours, then 910 µl (1 mmol) 1-bromopropane was injected into the solution. The reaction mixture was heated around 100° C. overnight. Then poured the solution into 150 ml cold water after cooling to room temperature. The solution was extracted with methylene chloride three times, and the combined organic phases were concentrated in vacuum to give prbi as grey oil. High yield (90%) pure product was obtained. $^1$H NMR (300 MHz, CDCl$_3$) δ (ppm): 0.95-1.00 (t, 3H), 1.88-2.00 (m, 2H), 4.13-4.17 (t, 2H), 7.29-7.44 (m, 3H), 7.82-7.85 (m, 2H).

Synthesis of 1,5-bis(1H-benzo[d]imidazol-1-yl)pentane (bbipe): 1.2 g (30 mmol) NaOH was added to a solution of 1.18 g (10 mmol) benzimidazole in 20 ml DMSO, the mixture was stirred at 70° C. for 2 hours, then 540 µl (4 mmol) 1,5-dibromopentane was injected into the solution. The reaction mixture was heated around 100° C. overnight. Then poured the solution into 150 ml cold water after cooling to room temperature. The solution was extracted with methylene chloride three times, and the combined organic phases were concentrated in vacuum to give bbipe as white solid. Pure product of high yield (90%) was obtained after recrystallization with acetone/hexanes. $^1$H NMR (300 MHz, CDCl$_3$) δ (ppm): 1.31-1.42 (m, 2H), 1.86-1.96 (m, 4H), 4.12-4.17 (m, 4H), 7.26-7.32 (m, 6H), 7.80-7.84 (m, 4H).

Synthesis of 1,5-bis(6-methyl-1H-benzo[d]imidazol-1-yl)pentane (bmbipe): The compound was synthesized in a similar way as bbipe using 6-methyl-1H-benzo[d]imidazole affording compound bmbipe as grey solid, yield 85%. $^1$H NMR (300 MHz, CDCl$_3$) δ (ppm): 1.33-1.39 (m, 2H), 1.86-1.89 (m, 4H), 2.50 (s, 6H), 4.07-4.13 (m, 4H), 7.10-7.24 (m, 4H), 7.27-7.67 (m, 2H), 7.70-7.79 (m, 2H).

Synthesis of 1,5-di(1H-imidazol-1-yl)pentane (dipe): The compound was synthesized in a similar way as bbipe using imidazole affording compound dipe as colorless oil, yield 90%. $^1$H NMR (400 MHz, CDCl$_3$) δ (ppm): 1.26-1.30 (m, 2H), 1.59-1.81 (m, 4H), 3.88-3.92 (m, 4H), 6.89-7.07 (m, 4H), 7.34-7.44 (m, 2H).

Synthesis of 1-((methylthio)methyl)-1H-benzo[d]imidazole (msmbi): 1.2 g (30 mmol) NaOH was added to a solution of 1.18 g (10 mmol) benzimidazole in 20 ml DMSO, the mixture was stirred at 150° C. for 24 hours. Then poured the solution into 150 ml cold water after cooling to room temperature. The solution was extracted with methylene chloride three times, and the combined organic phases were concentrated in vacuum to give msmbi as grey oil. Yield (50%) pure product was obtained. $^1$H NMR (300 MHz, CDCl$_3$) δ (ppm): 2.04 (s, 3H), 5.18 (s, 2H), 7.27-7.34 (m, 2H), 7.50-7.84 (m, 2H), 7.98 (s, 1H).

B. Synthesis of Compounds 1-17

Synthesis of 0D-Cu$_4$I$_4$(py)$_4$ (1): The synthesis of 1 was carried out by a modified version of the reported method. CuI (0.19 g, 1.0 mmol) was well-dispersed in 20 ml ethanol in a closed reaction vail, excess py (0.32 g, 4.0 mmol) was added directly into the reaction solution under magnetic stirring at room temperature. After 30 minutes, the precipitate was filtered out and washes with ethanol for three times. Then it was died in vacuum oven overnight before characterization. The identical washing and drying procedures were applied for other compounds except otherwise mentioned (80% yield based on Cu).

Synthesis of 0D-Cu$_4$I$_4$(3-bzo-py)$_4$ (2): Compound 2 was synthesized by precursor method. 0D-Cu$_4$I$_4$(py)$_4$ precursor (0.11 g, 0.1 mmol) and excess 3-bzo-py (0.07 g, 0.4 mmol) were mixed in ethanol in a closed reaction vial at room temperature under magnetic stirring. Single crystals that are suitable for analysis were obtained by keeping the reaction at 100° C. for 5 days in thick-wall Pyrex tubes. Yellow rod-shaped crystals were obtained (76% yield based on Cu).

Synthesis of 0D-Cu$_4$I$_4$(3-pc)$_4$ (3): The synthesis of pure powder sample of 3 was similar to that of 2 except the ligand, precursor 1 (0.1 mmol) and 3-pc (0.4 mmol) mixture was stirred in ethanol at room temperature (92% yield based on Cu).

Synthesis of 0D-Cu$_4$I$_4$(4-bz-py)$_4$ (4): The synthesis of pure powder sample of 4 was similar to that of 2 except the ligand. Orange cubic crystals were obtained after precursor 1 (0.1 mmol) and 4-bz-py (0.4 mmol) mixture was heated at 100° C. for 5 days in a thick-wall Pyrex tube (90% yield based on Cu).

Synthesis of 0D-Cu$_4$I$_4$(4-ph-py)$_4$ (5): The synthesis of pure powder sample of 5 was similar to that of 2, precursor 1 (0.1 mmol) and 4-ph-py (0.4 mmol) mixture was stirred in ethanol (86% yield based on Cu).

Synthesis of 0D-Cu$_4$I$_4$(prbi)$_4$ (6): Pure powder sample of 6 was obtained through similar precursor method as used in synthesizing 2. Precursor 1 (0.1 mmol) and prbi (0.4 mmol) were stirred in methanol. The transparent crystal was obtained after reaction in sealed Pyrex tube at 100° C. for 2 days (90% yield based on Cu).

Synthesis of 1D-Cu$_4$I$_4$(bbipe)$_2$ (7): Single crystals of 7 were grown by reaction of precursor 1 (0.14 g, 0.1 mmol) and bbipe (0.15 g, 0.5 mmol) at 120° C. in methanol for 3 days. Yellow crystals were isolated by filtration and washing (66% yield based on Cu).

Synthesis of 1D-Cu$_4$I$_4$(msmbi)$_2$ (8): Pure powder sample of 8 was prepared by heating the precursor 1 (0.1 mmol) and msmbi (0.3 mmol) at 120° C. in ethanol for 3 days (58% yield based on Cu).

Synthesis of 2D-Cu$_4$I$_4$(pda)$_2$ (9): Similar precursor method and procedures as that of 7 were used except ligand, precursor 1 (0.14 g, 0.1 mmol) and pda (0.15 g, 0.5 mmol) at 120° C. in methanol for 3 days (72% yield based on Cu).

Synthesis of 2D-Cu$_4$I$_4$(dipe)$_2$ (10): Similar precursor method and procedures as that of 7 with dipe. Nice crystals were obtained in methanol after precursor 1 (0.1 mmol) and dipe (0.5 mmol) mixture was heated for 3 days at 150° C. (72% yield based on Cu).

Synthesis of 2D-Cu$_4$I$_4$(bmbipe)$_2$ (11): Excess bmbipe (0.25 mmol) was added to the precursor (0.14 g, 0.1 mmol) in ethanol solution under stirring at room temperature. Powders of 11 were formed after 1 hour of stirring. Single crystals were obtained in methanol after heating for 3 days at 150° C. (74% yield based on Cu).

Synthesis of 2D-Cu$_4$I$_4$(bpp)$_2$ (12): Precursor method was used and detailed procedure was similar as that of 8, precursor 1 (0.1 mmol) and bpp (0.3 mmol) was heated at 120° C. in ethanol for 3 days (Yield is 85% based on Cu).

Synthesis of 2D-Cu$_4$I$_4$(5-me-pm)$_2$ (13): Single crystals of 13 were collected from the reaction of precursor (0.14 g, 0.1 mmol) and excess amount of 5-me-pm (0.047 g, 0.05 mmol) in 10 ml ethanol at 120° C. for 1 day. Green cubic crystals, along with pure phase of powders were isolated and washed. (71% yield based on Cu)

Synthesis of 2D-Cu$_4$I$_4$(4,4'-dps)$_2$ (14): The detailed synthesis process of 14 was similar to that for 8, powder sample of 14 was prepared by heating the precursor 1 (0.1 mmol) and 4,4'-dps (0.3 mmol) at 120° C. in ethanol for 3 days (81% yield based on Cu).

Synthesis of 3D-Cu$_4$I$_4$(1,4-bda)$_2$ (15): Similar precursor method as that of 8 was used. High quality plate like crystals were obtained after precursor 1 (0.1 mmol) and 1,4-bda (0.3 mmol) mixture was heated in methanol for 3 days under 120° C. condition (75% yield based on Cu).

Synthesis of 3D-Cu$_4$I$_4$(en)$_2$ (16): Pure phased powder sample of compound 16 was obtained by heating the precursor 1 (0.1 mmol) and 4,4'-dps (0.3 mmol) at 120° C. in ethanol for 3 days (70% yield based on Cu).

Synthesis of 3D-Cu$_4$I$_4$(dipe)$_2$ (17): Similar synthesis approach as that of compound 10 was used, using methanol (1 ml) and N,N-dimethylformamide (DMF) (1 ml) as solvents, precursor 1 (0.1 mmol) and dipe (0.5 mmol) mixture was heated for 3 days at 150° C. (70% yield based on Cu).

C. Study of Compounds

The 0D-Cu$_4$I$_4$(py)$_4$ (1) was selected as a molecular precursor for the synthesis. It was well dispersed in ethanol solution prior to ligand substitution. The stability of the cluster in ethanol was confirmed via UV-Vis absorption spectroscopy. Ligand substitution was accomplished through the addition of a second multi-dentate ligand to the solution accompanied by heating. A variety of ligands with different types, lengths and functional groups (including several newly designed imidazole derivatives) were successfully exchanged with py of the precursor.

TABLE 1

List of new $Cu_4I_4$ based compounds with unit cell parameters and space groups.

| Compound | Unit Cell Constants (Å, °) | Space Group |
|---|---|---|
| 0D-$Cu_4I_4$(3-bzo-py)$_4$ (2) | a = 20.7422 (13)<br>b = 15.9253 (10)<br>c = 17.7211 (18)<br>β = 121.6130 (10) | C2/c |
| 0D-$Cu_4I_4$(4-bz-py)$_4$ (4) | a = 18.1159 (8)<br>b = 22.3929 (10)<br>c = 23.9526 (10)<br>β = 92.959 (3) | P2$_1$/c |
| 0D-$Cu_4I_4$(prbi)$_4$ (6) | a = 23.8687(8)<br>b = 23.8070(9)<br>c = 19.3331(7)<br>β = 124.010(2) | C2/c |
| 1D-$Cu_4I_4$(msmbi)$_2$ (8) | a = 10.9115(4)<br>b = 11.0763(4)<br>c = 12.8694(5)<br>α = 71.844(2)<br>β = 85.177(2)<br>γ = 85.809(2) | P-1 |
| 2D-$Cu_4I_4$(dipe)$_2$ (10) | a = 8.7880 (4)<br>b = 20.3211 (11)<br>c = 18.57702 (9)<br>β = 99.700 (2) | Cc |
| 2D-$Cu_4I_4$(bmbipe)$_2$ (11) | a = 11.4927 (4)<br>b = 14.4582 (5)<br>c = 15.9437 (6)<br>α = 77.440 (2)<br>β = 71.127 (2)<br>γ = 75.992 (2) | P-1 |
| 2D-$Cu_4I_4$(5-me-pm)$_2$ (13) | a = 13.1679 (4)<br>b = 10.7065 (4)<br>c = 14.8078 (5)<br>β = 105.146 (2) | C2/c |
| 3D-$Cu_4I_4$(1,4-bda)$_2$ (15) | a = 7.3332(4)<br>b = 7.3925(4)<br>c = 20.3805 (10)<br>α = 85.853 (3) | P-1 |
| 3D-$Cu_4I_4$(dipe)$_2$ (17) | β = 79.752 (2)<br>γ = 89.939(10)<br>a = 17.5305 (8)<br>b = 36.1060 (17)<br>c = 10.7829 (5) | Fdd2 |

3-bzo-py = 3-benzyloxy-pyridine,
4-bz-py = 4-benzyl-pyridine,
prbi = 1-propyl-1H-benzo[d]imidazole,
msmbi = 1-((methylthio)methyl)-1H-benzo[d]imidazole,
dipe = 1,5-di(1H-imidazol-1-yl)pentane,
bmbipe = 1,5-bis(5-methyl-1H-benzo[d]imidazol-1-yl)pentane,
5-me-pm = 5-methyl-pyrimidine, 1,4-bda = 1,4-butanediamine
Samples of both single crystal and power forms were obtained. Single crystal data for 9 new compounds: 2, 4, 6 (0D), 8 (1D), 10, 11, 13 (2D), and 15, 17 (3D) are summarized in Table 1. The purity of the powder samples was confirmed by powder X-ray diffraction (PXRD) analysis.

All of the structures display a sharp optical absorption edge, as measured by UV-Vis absorption spectroscopy. The high absorption coefficients suggest they are strong energy absorbers, ideal for phosphors. Bandgaps were estimated from optical absorption spectra and the values are listed in Table 2. DFT calculations were conducted on selected structures of different dimensionalities. The results indicate that for compounds containing aromatic ligands (e.g. 6, 7, 8, 14) the atomic states that make up the conduction band minimum (CBM) are mostly from organic ligands (C 2p and N 2p), while the atomic states in the valence band maximum (VBM) region are mainly from the inorganic components (Cu 3d and I 5p). This suggests a MLCT or XLCT (or a combination of the two) mechanism for such systems, which resemble what was observed for 1D-CuI(L) stair-case chain and $Cu_2I_2$ rhomboid dimer based structures. For compounds built of aliphatic ligands (e.g. 9, 15), on the other hand, both VBM and CBM are com-posed of inorganic atomic states, therefore the emission is primarily cluster centered (CC).

TABLE 2

Estimated band gaps, emission energies, colors, IQY values and decomposition temperatures of $Cu_4I_4$-based compounds ($\lambda_{ex}$ = 360 nm).

| # | Compounds | Band gap (eV) | $\lambda_{em}$ (nm) | Color | IQY (%) | Decomp. Temp. (° C.) |
|---|---|---|---|---|---|---|
| 1 | 0D-$Cu_4I_4$(py)$_4$ | 2.7 | 560 | Yellow | 92.3 ± 1.1 | 60 |
| 2 | 0D-$Cu_4I_4$(3-bzo-py)$_4$ | 2.9 | 590 | Yellow | 85.6 ± 0.4 | 130 |
| 3 | 0D-$Cu_4I_4$(3-pc)$_4$ | 2.8 | 560 | Yellow | 94.3 ± 1.2 | 60 |
| 4 | 0D-$Cu_4I_4$(4-bz-py)$_4$ | 2.7 | 560 | Yellow | 95.7 ± 1.3 | 120 |
| 5 | 0D-$Cu_4I_4$(4-ph-py)$_4$ | 2.6 | 545 | Yellow | 93.2 ± 0.3 | 110 |
| 6 | 0D-$Cu_4I_4$(prbi)$_4$ | 2.7 | 600 | orange | 96.1 ± 1.1 | 160 |
| 7 | 1D-$Cu_4I_4$(bbipe)$_2$ | 2.7 | 560 | Yellow | 71.8 ± 1.3 | 320 |
| 8 | 1D-$Cu_4I_4$(msmbi)$_2$ | 3.2 | 550 | Yellow | 70.2 ± 0.3 | 150 |
| 9 | 2D-$Cu_4I_4$(pda)$_2$ | 3.0 | 616 | Orange | 65.3 ± 0.5 | 200 |
| 10 | 2D-$Cu_4I_4$(dipe)$_2$ | 2.8 | 620 | Orange | 64.4 ± 0.7 | 290 |
| 11 | 2D-$Cu_4I_4$(bmbipe)$_2$ | 2.7 | 550 | Yellow | 67.1 ± 0.4 | 350 |
| 12 | 2D-$Cu_4I_4$(bpp)$_2$ | 2.6 | 613 | Orange | 56.2 ± 0.5 | 240 |
| 14 | 2D-$Cu_4I_4$(4,4'-dps)$_2$ | 2.4 | 577 | Yellow | 60.6 ± 1.2 | 220 |
| 15 | 3D-$Cu_4I_4$(1,4-bda)$_2$ | 3.1 | 585 | Yellow | 60.7 ± 1.4 | 230 |
| 16 | 3D-$Cu_4I_4$(en)$_2$ | 3.0 | 590 | Yellow | 70.1 ± 1.2 | 160 |
| 17 | 3D-$Cu_4I_4$(dipe)$_2$ | 2.9 | 580 | Yellow | 65.6 ± 1.3 | 300 |

Solid state photoluminescence spectra were collected at room temperature (RT). The emission spectra confirm that all compounds emit strongly in the yellow-orange color region (emission maxima: 545-620 nm, FIG. 2a) and their emission profile is a single band type. The internal quantum yields (IQYs) of these compounds were measured at room temperature. The values range from 56% to 96%. High IQYs are maintained in extended network structures (1D-3D), as in the case of molecular cubanes. Luminescence decay measurements were conducted on selected compounds (4, 7, 11 and 15). Their lifetime values are 14.48, 14.13, 15.26 and 11.74 μs, respectively, characteristic of typical phosphor materials. The fact that extended structures have similar lifetimes as the $Cu_4I_4$ clusters suggests that the emission behaviors of the two types of structures are similar.

The most significant improvement achieved upon formation of extended network structures (1D-3D) from molecular clusters (0D) is the strong enhancement of their framework stability. Thermogravimetric (TG) analysis was carried out on powder samples, and their decomposition temperatures are listed in Table 2. In the case of 0D structures, most compounds collapse between 60 and 130° C. For extended network structures (1D-3D), the frameworks remain intact up to 200° C. or higher (Table 2). The framework stability also depends on the relative Cu—N bond strength. When comparing structures of the same dimensionality but different types of ligands (i.e. pyridine vs imidazole derivatives), for example, 1 and 6 (0D), 9 and 11 (2D), and 15 and 17 (3D), the latter group shows substantially higher thermal stability. This is because imidazole-based ligands are stronger electron donors, thereby giving rise to stronger Cu—N bond.

Figure 2:
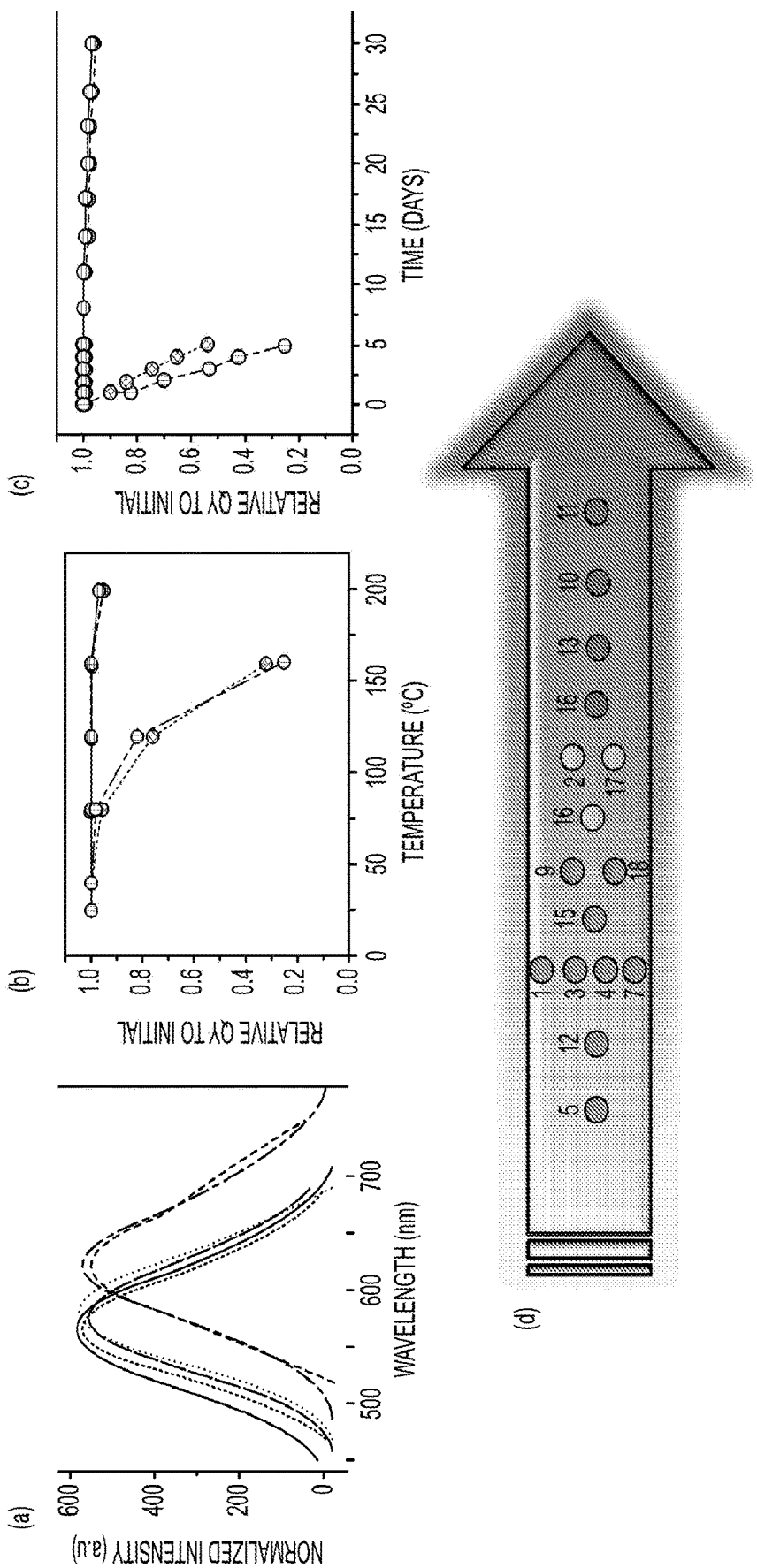
FIGS. 2(a)-2(d) illustrates characteristics of selected compounds. 2(a) Photoluminescence spectra ($\lambda_{ex}$=360 nm) of selected compounds: 3 (black), 7 (red), 10 (blue), 11 (green), 15 (orange), 17 (purple); 2(b) Plot of IQYs measured before and after heating at different temperatures for 24 h without protection: 1 (green), 3 (blue), 11 (black), 17 (red); 2(c) Plot of IQYs measured before and after exposing to UV light as a function of time (up to 30 days): 1 (green), 3 (blue), 11 (black), 17 (red); 2(d) Compounds and their emission color.

A series photostability tests were conducted on these phosphors to evaluate their potential for use in lighting devices. Two structures, $2D-Cu_4I_4(bmbipe)_2$ (11) and $3D-Cu_4I_4(dipe)_2$ (17), were heated in the oven (in air, without protection) at different temperatures for 24 h. Their PXRD patterns remain unchanged and the decrease in IQY is less than 1% at a temperature as high as 180° C. (FIG. 2b). As a comparison, when $0D-Cu_4I_4(py)_4$ (1) and $0D-Cu_4I_4(3-pc)_4$ (3) were heated under identical conditions, their PXRD patterns showed greatly reduced crystallinity and IQY values dropped more than 70% at 150° C., indicative of poor thermal and photostability as a result of losing crystallinity. A long-term photostability test was conducted on $2D-Cu_4I_4(bmbipe)_2$ (11) and $3D-Cu_4I_4(dipe)_2$ (17), in which the phosphors were coated on a glass plate and exposed to UV light to mimic the working condition. IQY was measured before and after the exposure, and the results show that the IQY remain almost the same after 30 days of continuous and unprotected exposure in air (2.5% decreased in IQY values, FIG. 2c), which is significantly better than $0D-Cu_4I_4(py)_4$ and $0D-Cu_4I_4(3-pc)_4$ structures under the identical conditions. The latter compounds dropped 70% in IQY values. The greatly enhanced stability and high quantum efficiency make the $Cu_4I_4$-based network structures the most suitable candidates as lighting phosphors.

In order to generate white light, high quantum yield $1D-Cu_2I_2(tpp)_2(bpp)$ (tpp=triphenylphosphine) blue phosphor (BP) was selected to blend with selected yellow- or orange-emitting $Cu_4I_4$-based 2D and 3D compounds as two-component white phosphors. These CuI(L) structures have relatively large Stokes shift which effectively prevents self-absorption. The results for various ratios of 10/BP and 17/BP are summarized in Table 3. The wt % of BP in the composite is usually less than 20%, since the energy loss of the blue light from self-absorption is effectively prevented.

Important color parameters, such as CIE, CRI and CCT were measured to evaluate their overall color quality (Table 3). The IQYs of these white phosphors are between 70% and 82%, among the highest values reported to date. Compound 10 emits orange light with a large Stokes shift, and as a result its composite phosphors emit much warmer white light, with CCT values between 2500 and 3200 K.

TABLE 3

CIE, CRI, CCT and IQY of composite white phosphors.

| Sample Label | | wt % of BP | CIE | CRI | CCT(K) | IQY(%) |
|---|---|---|---|---|---|---|
| — | BP | — | 0.16, 0.17 | — | — | 91.1 ± 1.1 |
| M1 | 17/BP | 16 | 0.34, 0.35 | 73.9 | 4988 | 82.2 ± 0.4 |
| M2 | 17/BP | 12 | 0.35, 0.37 | 71.2 | 4613 | 76.3 ± 0.5 |
| M3 | 17/BP | 8 | 0.40, 0.43 | 62.3 | 3736 | 71.7 ± 1.2 |
| M4 | 10/BP | 14 | 0.39, 0.34 | 78.9 | 3132 | 80.1 ± 0.5 |
| M5 | 10/BP | 11 | 0.40, 0.30 | 70.3 | 2712 | 76.5 ± 1.2 |
| M6 | 10/BP | 8 | 0.41, 0.31 | 72.4 | 2534 | 70.3 ± 0.3 |

The $Cu_4I_4$-based phosphors are also solution processable, allowing for facile coating on various substrates. A solution of water soluble binder PolyOx N-750 and the M4 phosphor was prepared in bulk ethanol, which was solidified after the evaporation of the ethanol leaving behind a thin resin film of uniformly dispersed phosphor. A prototype lighting device was fabricated using a remote coating approach in which the phosphor was separated from the excitation source. To prepare the device, a thin layer of the phosphor with binder was coated onto the inner surface of a lamp covering. To evaluate the coating quality, the coated layer was removed from the surface as uniform thin film. A UV fluorescent light bulb was installed inside the lamp to serve as the excitation source. At working condition, the lamp produces pure warm white light. After several weeks of constant illumination, the light quality is unchanged, as the phosphors are stable under working conditions.

It will be understood by those of skill in the art that numerous and various modifications can be made without departing from the spirit of the present invention. Therefore, it should be understood that the various embodiments of the present invention described herein are illustrative only and not intended to limit the scope of the present invention.

The invention claimed is:
1. An inorganic-organic hybrid phosphor compound of $Cu_mX_m(L_1)_o(L_2)_p$, wherein:
   X is a halogen,
   $L_1$ is an organic multi-dentate ligand, wherein at least two atoms of the ligand are heteroatoms independently selected from the group consisting of N, O and S and each of said at least two atoms is coordinated to a Cu atom in a respective $Cu_mX_m$ cluster so that each of said $L_1$ links two Cu atoms, wherein the two Cu atoms are in two separate $Cu_mX_m$ clusters,
   $L_2$ is an organic mono-dentate or multi-dentate ligand, wherein at least 1 atom of the ligand are heteroatoms independently selected from the group consisting of N, O and S and the Cu atom is coordinated to one of these heteroatoms,
   m is an integer selected from the group consisting of 1, 3, 4, 5 and 6,
   o is selected from the group consisting of 1, 2, 3, 4, 5 and 6, and
   p is selected from the group consisting of 0, 1, 2, 3, 4, 5 and 6, wherein the atoms of said compound are arranged to form a network having a 1D, 2D or 3D crystalline lattice structure,
provided that $L_1$ is selected from the group consisting of 5-methyl-pyrimidine (5-me-pm), 4,6-dimethyl-pyrimidine (4,6-dm-pm), 1,3-propandiamine (pda), 3,3'-bipyridine (3,3'-bpy), 4,4'-dipyridyl sulfide (4,4'-dps), ethylene diamine (en), bibenzoimidazolylpentane (bbipe), diimidazolylpentane (dipe), bi-5-methyl-benzoimid-azolylpentane (bmbipe), 1,4-butyldiamine (1,4-bda), bi-5,6-di-methyl-benzoimidazolyl-pentane (bdmbipe), and 1-(methylsulfur-methylenyl)-benzoimidazole (msmbi).

2. The inorganic-organic hybrid phosphor compound of claim 1, wherein X is I, and m is 4.

3. The inorganic-organic hybrid phosphor compound of claim 1, wherein said crystalline lattice structure consists essentially of a copper-iodide motif selected from the group consisting of dimers, trimers, and tetramers.

4. The inorganic-organic hybrid phosphor compound of claim 1, wherein said crystalline lattice structure consists essentially of $Cu_4I_4$ cubane tetramers.

5. The inorganic-organic hybrid phosphor compound of claim 1, wherein m is 4 and said crystalline structure is formed from a plurality of recur-ring 1D-$Cu_4X_4(L_1)_2$ lattice structures, wherein said recurring 1D-$Cu_4X_4(L_1)_2$ structure is formed from a recurring unit of $Cu_4X_4(L_1)_2$.

6. The inorganic-organic hybrid phosphor compound of claim 5, wherein said 1D lattice structures stack together with each other through the aligned organic ligands to form orderly 2D and/or 3D crystalline lattice structures.

7. The inorganic-organic hybrid phosphor compound of claim 1, wherein m is 4 and said crystalline structure is formed from a plurality of recurring 2D-$Cu_4X_4(L_1)_2$ lattice structures, wherein said recurring 2D-$Cu_4X_4(L_1)_2$ structure is formed from a recurring unit of $Cu_4X_4(L_1)_2$.

8. The inorganic-organic hybrid phosphor compound of claim 1, wherein m is 4 and said crystalline structure is formed from a plurality of recurring 3D-$Cu_4X_4(L_1)_2$ lattice structures, wherein said recurring 3D-$Cu_4X_4(L_1)_2$ structure is formed from a recurring unit of $Cu_4X_4(L_1)_2$.

9. The inorganic-organic hybrid phosphor compound of claim 1, wherein X is I, and $L_1$ comprises a 5- and/or 6-membered substituted or unsubstituted heteroaromatic group.

10. The inorganic-organic hybrid phosphor compound of claim 1, wherein said compound is selected from the group consisting of 1D-$Cu_4I_4$(bbipe)$_2$, 1D-$Cu_4I_4$(msmbi)$_2$, 2D-$Cu_4I_4$(pda)$_2$, 2D-$Cu_4I_4$(dipe)$_2$, 2D-$Cu_4I_4$(bmbipe)$_2$, 2D-$Cu_4I_4$(4,4'-dps)$_2$, 3D-$Cu_4I_4$(1,4-bda)$_2$, 3D-$Cu_4I_4$(en)$_2$, 3D-$Cu_4I_4$(dipe)$_2$, and 2D-$Cu_4I_4$(5-me-pm)$_2$.

11. The inorganic-organic hybrid phosphor compound of claim 1, wherein said inorganic-organic hybrid phosphor compound is $Cu_4I_4(L_1)_2$ which is a yellow or orange phosphor.

12. A light-emitting diode characterized by a chip in conductive contact with an anode and a cathode, said chip coated with the inorganic-organic hybrid phosphor compound according to claim 1.

13. A method of emitting a visible light comprising
(a) placing a chip coated with the inorganic-organic compound of claim 1 in conductive contact between an anode and a cathode within a reflective cavity; and
(b) passing a current from the anode to the cathode.

14. A method of preparing the phosphor compound of claim 1, comprising the steps of
(a) providing a compound of $Cu_4X_4(L_1')_o(L_2')_p$, wherein X is a halogen, $L_1'$ and $L_2'$ are each a mono-dentate ligand, and o and p are each independently selected from the group consisting of 0, 1, 2, 3, 4, 5 and 6, provided that o and p are not both 0;
(b) mixing said compound with a multi-dentate ligand $L_1$ in a solution; and
(c) isolating said phosphor compound, wherein said $L_1$ links two Cu atoms in two separate clusters.

15. The inorganic-organic hybrid phosphor compound of claim 1, wherein m is 4, 5 or 6.

16. The inorganic-organic hybrid phosphor compound of claim 1, wherein $L_1$ is selected from the group consisting of bibenzoimidazolylpentane (bbipe), diimidazolylpentane (dipe), bi-5-methyl-benzoimid-azolylpentane (bmbipe), bi-5,6-di-methyl-benzoimidazolyl-pentane (bdmbipe), and 1-(methylsulfur-methylenyl)-benzoimidazole (msmbi).

17. The inorganic-organic hybrid phosphor compound of claim 1, wherein the compound is selected from the group consisting of 1D-$Cu_4I_4$(bbipe)$_2$, 1D-$Cu_4I_4$(msmbi)$_2$, 2D-$Cu_4I_4$(dipe)$_2$, 2D-$Cu_4I_4$(bmbipe)$_2$, 2D-$Cu_4I_4$(4,4'-dps)$_2$, 3D-$Cu_4I_4$(dipe)$_2$, and 2D-$Cu_4I_4$(5-me-pm)$_2$.

* * * * *